(12) United States Patent
Kuramoto et al.

(10) Patent No.: US 8,803,237 B2
(45) Date of Patent: *Aug. 12, 2014

(54) SEMICONDUCTOR DEVICE

(75) Inventors: Takafumi Kuramoto, Kanagawa (JP); Yasutaka Nakashiba, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/493,579

(22) Filed: Jun. 11, 2012

(65) Prior Publication Data

US 2012/0248543 A1    Oct. 4, 2012

Related U.S. Application Data

(62) Division of application No. 12/756,699, filed on Apr. 8, 2010, now Pat. No. 8,217,459.

(30) Foreign Application Priority Data

Apr. 9, 2009    (JP) .................................. 2009-094877

(51) Int. Cl.
*H01L 21/44*    (2006.01)

(52) U.S. Cl.
USPC .................. 257/355; 257/365; 257/E21.262; 257/E27.067; 257/E27.108

(58) Field of Classification Search
USPC .......................... 257/355, 365, 371, E21.632, 257/27.65–27.67, 97, 108–112
See application file for complete search history.

(56) References Cited

U.S. PATENT DOCUMENTS

| | | |
|---|---|---|
| 3,772,536 A | 11/1973 | Grannis et al. |
| 4,635,088 A | 1/1987 | Eguchi |
| 5,055,716 A | 10/1991 | El Gamel |
| 5,175,512 A | 12/1992 | Self |
| 5,231,300 A | 7/1993 | Terashima et al. |
| 5,298,774 A | 3/1994 | Ueda et al. |
| 5,708,880 A | 1/1998 | Kunishige et al. |
| 5,821,769 A | 10/1998 | Douseki |
| 5,886,558 A | 3/1999 | Iijima et al. |
| 5,990,502 A | 11/1999 | Park |
| 6,040,610 A | 3/2000 | Noguchi et al. |
| 6,134,171 A | 10/2000 | Yamagata et al. |
| 6,239,958 B1 | 5/2001 | Kato et al. |
| 6,441,448 B1 | 8/2002 | Maeda et al. |

(Continued)

FOREIGN PATENT DOCUMENTS

| | | |
|---|---|---|
| JP | 453255 A | 2/1992 |
| JP | 7235616 A | 9/1995 |

(Continued)

OTHER PUBLICATIONS

Office Action dated Jun. 18, 2013 issued by the Japanese Patent Office in counterpart Japanese Application No. 2009094877.

*Primary Examiner* — Michael Lebentritt

(74) *Attorney, Agent, or Firm* — Sughrue Mion, PLLC

(57) ABSTRACT

A distance "a" from a first gate electrode of a first transistor of a high-frequency circuit to a first contact is greater than a distance "b" from a second electrode of a second transistor of a digital circuit to a second contact. The first contact is connected to a drain or source of the first transistor, and the second contact is connected to a drain or source of the second transistor.

12 Claims, 5 Drawing Sheets

(56) References Cited

U.S. PATENT DOCUMENTS

| | | |
|---|---|---|
| 6,483,733 B2 | 11/2002 | Lines et al. |
| 6,545,321 B2 | 4/2003 | Morishita |
| 6,917,213 B2 | 7/2005 | Oosawa et al. |
| 7,068,548 B2 | 6/2006 | Nakamoto et al. |
| 7,755,147 B2 | 7/2010 | Satoh |
| 7,869,174 B2 | 1/2011 | Tanaka et al. |
| 8,217,459 B2 * | 7/2012 | Kuramoto et al. ............ 257/355 |
| 2005/0116781 A1 | 6/2005 | Yamamoto et al. |
| 2005/0127444 A1 | 6/2005 | Watanabe |
| 2010/0230780 A1 | 9/2010 | Obayashi |
| 2012/0020419 A1 | 1/2012 | Kaeriyama |

FOREIGN PATENT DOCUMENTS

| | | |
|---|---|---|
| JP | 9172146 A | 6/1997 |
| JP | 3282375 B2 | 3/2002 |
| JP | 2002-228906 | 8/2005 |
| JP | 200613061 A | 1/2006 |
| JP | 2006-100824 A | 4/2006 |
| JP | 200736216 A | 2/2007 |
| JP | 2008-085117 A | 4/2008 |
| JP | 2008252003 A | 10/2008 |
| WO | 2006-000993 A2 | 1/2006 |

\* cited by examiner

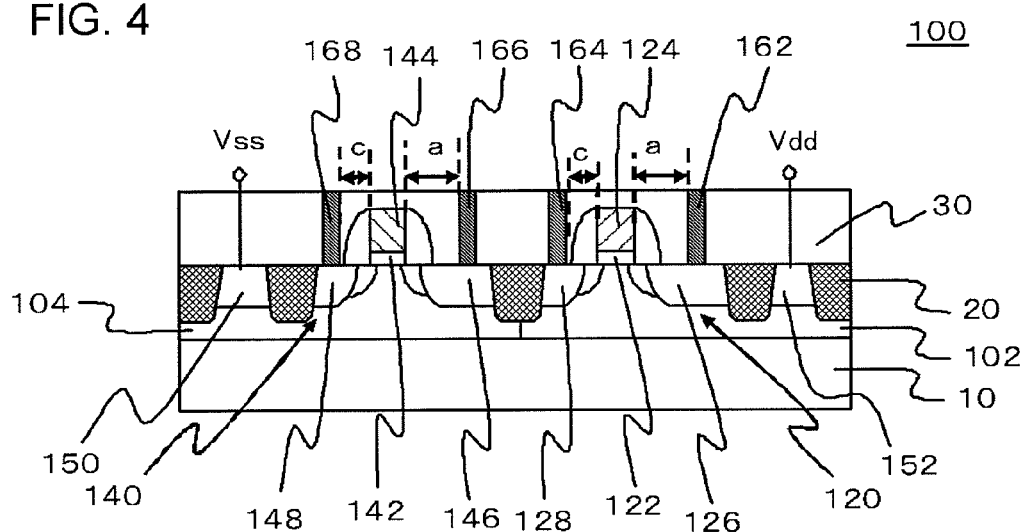
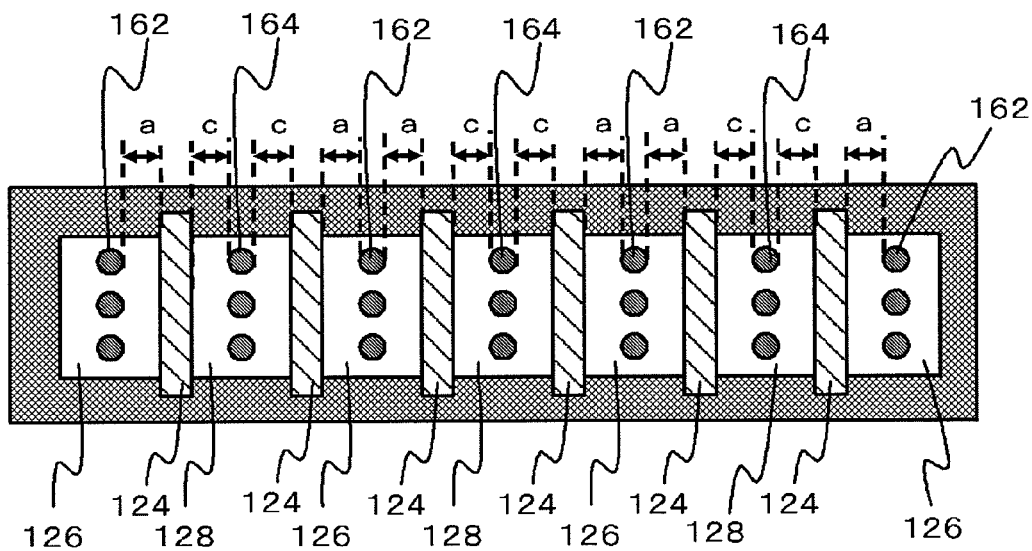

SEMICONDUCTOR DEVICE

This is application is a divisional of U.S. patent application Ser. No. 12/756,699, filed Apr. 8, 2010, which is based upon and claims the benefit of priority from Japanese Patent Application No. 2009-094877 filed on Apr. 9, 2009, the contents of all which are incorporated herein by reference in their entirety.

BACKGROUND

1. Technical Field

The present invention relates to a semiconductor device that consolidates a high-frequency circuit and a digital circuit.

2. Related Art

In recent years, as miniaturization of CMOS transistors has advanced, it has been possible to obtain characteristics where a current gain cut-off frequency f exceeds 100 GHz. To this end, for example, CMOS transistors have been used in place of compound transistors and bipolar transistors as transistors constituting high-frequency circuits for carrying out wireless communication etc. (for example, refer to patent documents Japanese translation of PCT international NO. 2008-503892, Japanese Laid-Open patent publication NO. 2008-85117, 2006-100824 and 2005-228906). It is therefore possible to consolidate digital circuits and high-frequency circuits on a single semiconductor chip when it becomes possible to make high-frequency circuits using CMOS transistors. It is therefore possible to put manufacturing know-how accumulated as a result of manufacturing of semiconductor devices constructed from digital circuits to use.

SUMMARY

Miniaturization is also advancing in order to increase the number of semiconductor chips it is possible the cut-out of a single wafer for semiconductor devices having digital circuits. As the miniaturization of semiconductor devices advances, so the gaps between contacts and gate electrodes of the transistors become narrow and the interconnect capacitance between contacts and gate electrodes increases. As interconnect capacitance increases for semiconductor devices having high-frequency circuits, so the frequency characteristics of the high-frequency circuits, for example, a current gain cut-off frequency $f_t$ falls. As the miniaturization of digital circuits advances for semiconductor devices consolidating digital circuits and high-frequency circuits, a smaller interconnect capacitance for the high-frequency circuit is desired.

In one embodiment, there is provided a semiconductor device comprising: a high-frequency circuit connected to a first power supply terminal; a first ground terminal, a digital circuit connected to a second power supply terminal and a second ground terminal; a first transistor constituting part of the high-frequency circuit; a second transistor constituting part of the digital circuit; a first contact connected to a source or drain of the first transistor, and a second contact connected to a source or drain of the second transistor. A distance "a" from a first gate electrode that is a gate electrode of the first transistor to the first contact is greater than a distance "b" from a second gate electrode that is the gate electrode of the second transistor to the second contact.

According to the embodiment, a distance "a" from the first gate electrode of the first transistor of the high-frequency circuit to the first contact is greater than the distance "b" from the second gate electrode of the second transistor of the digital circuit to the second contact. It is therefore possible to advance miniaturization of digital circuits and make capacitance between interconnect for high-frequency circuits small.

Effects of the Invention

According to the present invention, it is possible to advance miniaturization of digital circuits and make capacitance between interconnect for high-frequency circuits small.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a cross-sectional view of a configuration for the essential parts of a semiconductor device of a second embodiment;

FIG. 5 is a plan view of a configuration for the essential parts of a semiconductor device of a third embodiment.

DETAILED DESCRIPTION

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the present invention are explained in the following using the drawings. Elements of the configuration that are the same are given the same numerals in all of the diagrams and descriptions thereof are omitted as appropriate.

Figure 1A:
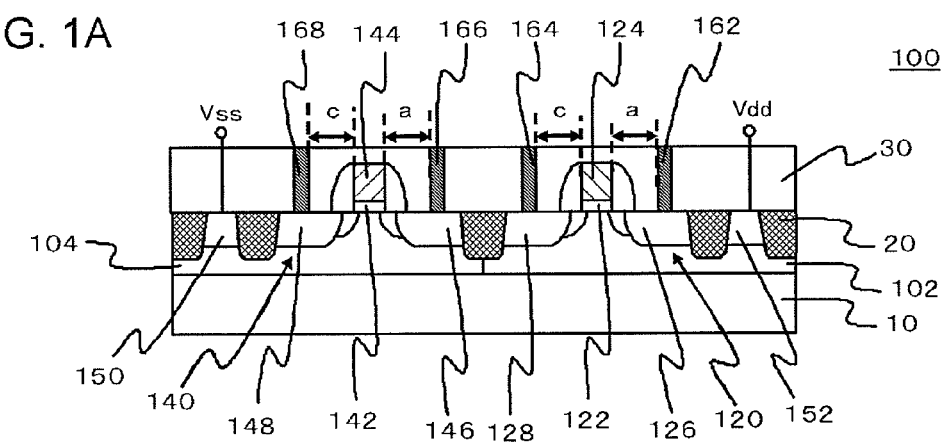
FIGS. 1A and 1B are cross-sectional views of the essential parts of a semiconductor device of a first embodiment.
Figure 1B:
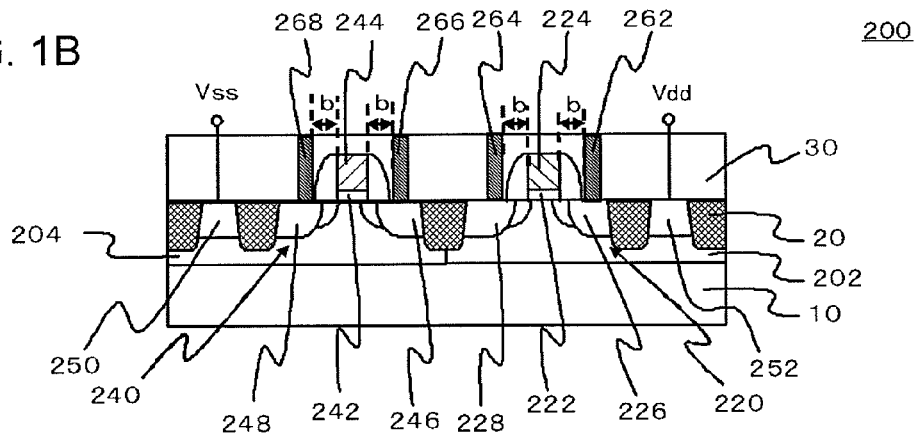
Figure 2A:
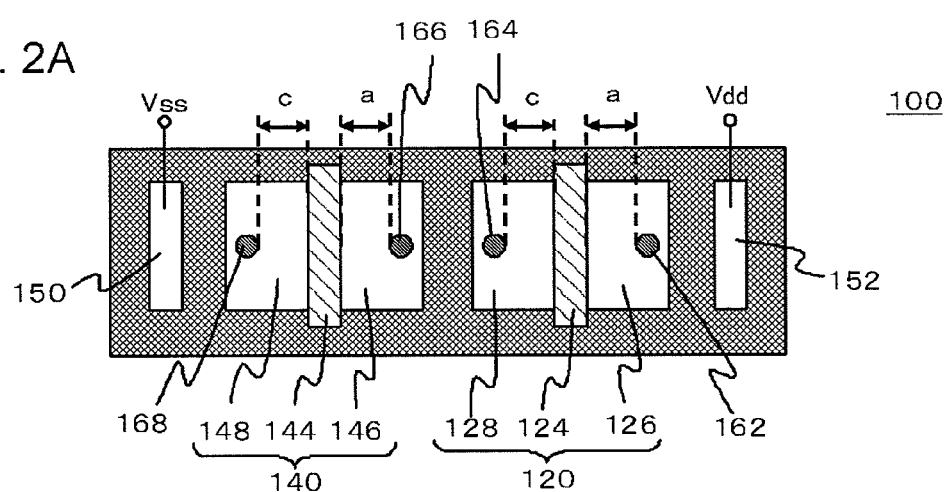
FIGS. 2A and 2B are plan views of the essential parts of the semiconductor device.
Figure 2B:
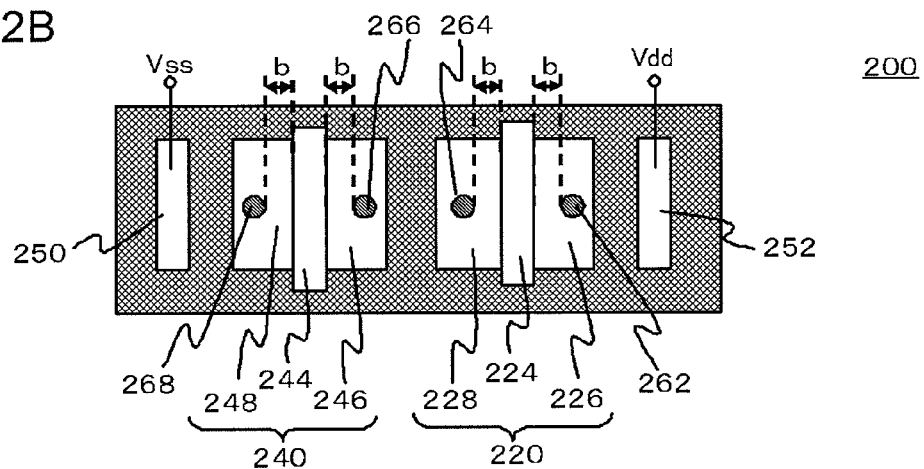
Figure 3:
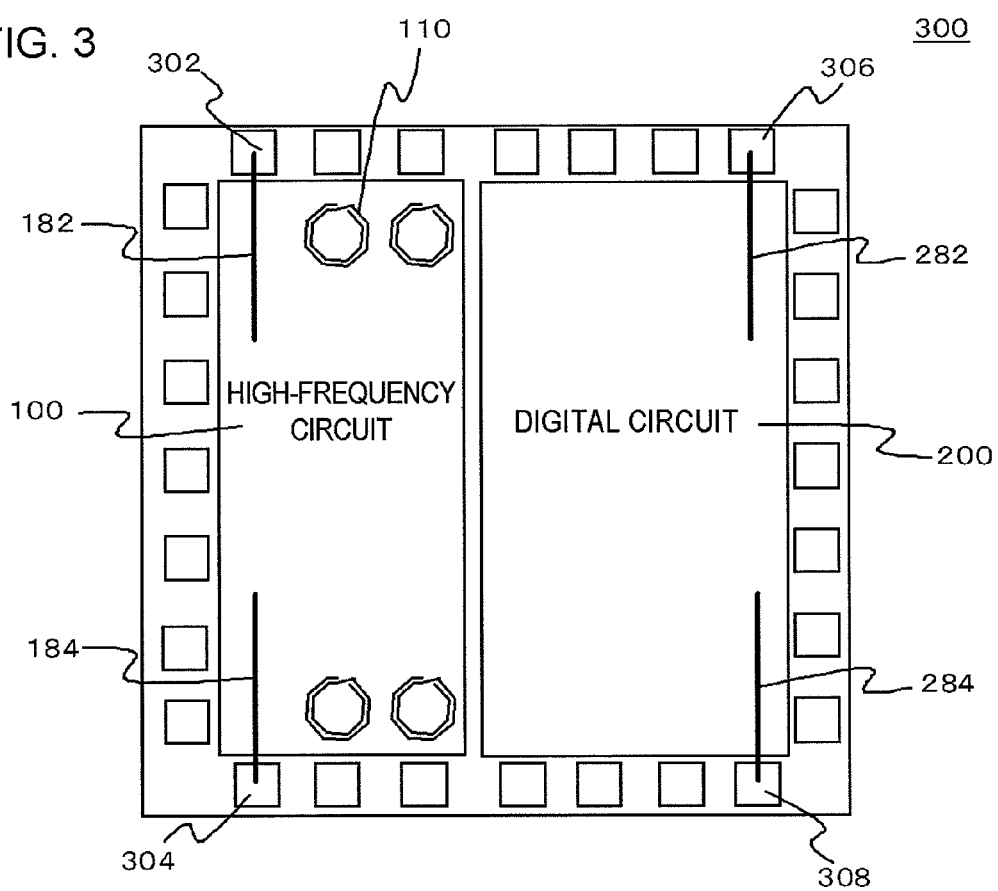
FIG. 3 is a plan view showing the whole of the semiconductor device shown in FIGS. 1A to 2B.

FIGS. 1A and 1B are cross-sectional views of the essential parts of a semiconductor device of a first embodiment, and FIGS. 2A and 2B are plan views of the essential parts of a semiconductor device of this embodiment. FIG. 3 is a plan view showing the whole of the semiconductor device shown in FIGS. 1A to 2B;

A semiconductor device 300 of this embodiment includes a high-frequency circuit 100 and a digital circuit 200, as shown in FIG. 3. The high-frequency circuit 100 is, for example, an analog circuit for carrying out wireless communication and is connected to a first power supply terminal 302 and a first ground terminal 304 through interconnect 182, 184. The digital circuit 200 is a circuit for processing digital signals and is connected to a second power supply terminal 306 and a second ground terminal 308 through interconnect 282, 284. The high-frequency circuit 100 and the digital circuit 200 have separate power supplies as a counter measure against noise. However, these power supply voltages are equal. The high-frequency circuit 100 can input a high-frequency signal of, for example, 800 MHz or more. An inductor 110 and a variactor (not shown) are included at the high-frequency circuit 100.

In FIGS. 1A to 2B, FIGS. 1A and 2A are views showing essential parts of the high-frequency circuit 100, and FIGS. 1B and 2B are views showing the essential parts of the digital circuit 200. As shown in the drawings, the semiconductor device 300 shown in FIG. 3 has first transistors 120, 140, second transistors 220, 240, first contacts 162, 166, and second contacts 262, 264, 266, 268. The first transistors 120 and 140 are part of the high-frequency circuit 100 and the second transistors 220 240 are part of the digital circuit 200. The first contacts 162 and 166 are connected to sources 128 and 148 or drains 126 and 146 the first transistors 120 and 140. The second contacts 262, 264, 266, 268 are connected to sources 228, 248 or drains 226, 246 of the second transistors 220, 240. A distance "a" from the first gate electrodes 124, 144 that are gate electrodes of the first transistors 120, 140 to the first contacts 162, 166 is greater than a distance "b" from second electrodes 224, 244 that are gate electrodes of the second transistors 220, 240 to the second contacts 262, 264, 266, 268. The distance "a" is, for example, equal to or less than 200 nm, and the distance "b" is, for example, equal to or less than 100 nm. The distance "b" is the distance defined for the minimum design rule for the semiconductor device 300 shown in FIGS. 1A to 3. The first contacts 162, 166 and the second contacts 262, 264, 266, 268 are formed through an insulation film 30. The insulation film 30 is formed on a semiconductor substrate 10.

In the examples shown in FIGS. 1A to 2B, the first contacts 162, 166 are connected to the drains 126, 146 of the first transistors 120, 140. Third contacts 164, 168 are connected to the sources 128, 148 of the first transistors 120, 140. A distance "c" between the third contacts 164, 168 and the first gate electrodes 124, 144 is greater than the distance "b" and equal to the distance "a".

As shown in FIGS. 2A and 2B, planar shapes of the sources 128, 148 and the drains 126, 146 of the first transistors 120, 140 are such that the distances "a" and "c" are greater than the distance "b" and are therefore larger than the planar shapes for the sources 228, 248 and the drains 226, 246 of the second transistors 220, 240. The inductor 110 (FIG. 3) of a surface area greater than the first transistors 120, 140 is formed at the high-frequency circuit 100 where the first transistors 120, 140 are formed. The surface area required at the high-frequency circuit 100 is greatly influenced by the size and number of inductors 110. This means that it is difficult to make the semiconductor device 300 large even if the planar shape of the sources 128, 148 and the drains 126, 146 is made large.

As shown in FIGS. 1A and 1B, the first transistors 120, 140 and the second transistors 220, 240 are formed on the semiconductor substrate 10 of a silicon substrate etc. The first transistors 120, 140 and the second transistors 220, 240 are all constructed from CMOS transistors. The semiconductor substrate 10 is a substrate of a first conductive type (for example, p-type). The first transistor 120 and the second transistor 220 are transistors of a first conductive type (for example, a p-channel type) formed at second conductive type (for example, n-type) wells 102, 202. The first transistor 140 and the second transistor 240 are transistors of a second conductive type (for example, an n-channel type) formed at first conductive type (for example, p-type) wells 104, 204. Each transistor is separated by an element separating film 20. A ground potential Vss is supplied to the wells 104, 204 of the first conductive type through diffusion layers 150, 250 of the first conductive type (for example, p-type). The power supply potential Vdd is supplied to the wells 102, 202 of the second conductive type (for example, N type) through diffusion layers 152, 252 of the second conductive type (for example, N type).

The first transistors 120, 140 and the second transistors 220, 240 are formed in the same step. For example, gate insulation films 122, 142 of the first transistors 120, 140 are formed in the same step, and the sources 128, 228 and the drains 126, 226 are formed in the same step. And so, the sources 148, 248 and drains 146, 246 are formed in the same step. A step of injecting impurities into the channel of the first transistor 120 and a step of introducing impurities to the channel of the second transistor 220 are the same step, and a step of injecting impurities into the channel of the first transistor 140 and a step of introducing impurities into the channel of the second transistor 240 are the same step. This means that the first transistors 120, 140 and the second transistors 220, 240 are such that the thicknesses of the gate insulation films 122, 142, 222, 242 are equal, the impurity structures of the sources 128, 148, 228, 248 and the drains 126, 146, 226, 246 are equal, and the impurity structures of the channels are equal. "Impurity structure" referred to here is, for example, the type of impurity and the impurity distribution in a depth direction and does not include the planar shape.

The high-frequency circuit 100 includes a plurality of transistors where the distances "a" and "c" are all greater than the distance "b" as with the first transistors 120, 140 shown in FIGS. 1A to 2B.

Next, an explanation is given of the operation and effects of this embodiment. According to this embodiment, it is possible to form the first transistors 120, 140 constituting the high-frequency circuit 100 and the second transistors 220, 240 constituting the digital circuit 200 in the same process. It is therefore possible to reduce manufacturing costs for the semiconductor device 300 compared to where the first transistors 120, 140 and the second transistors 220, 240 are formed in separate steps. It is therefore possible to put manufacturing know-how accumulated as a result of manufacturing of semiconductor devices constructed from digital circuits to use and to advance miniaturization of the digital circuit 200.

The distance "a" from first gate electrodes 124, 144 of the first transistors 120, 140 to the first contacts 162, 166 is greater than the distance "b" from the second gate electrodes 224, 244 of the second transistors 220, 240 to the second contacts 262, 264, 266, and 268. It is therefore possible to advanced miniaturization of the digital circuit 200 and make interconnect capacitance between the first gate electrodes 124, 144 and the first contacts 162, 166 small. This effect is remarkable when the distance "a" for all of the transistors of the high-frequency circuit 100 is larger than "b".

FIG. 4 is a cross-sectional drawing showing a structure for the essential parts of a semiconductor device 300 of a second embodiment and is a drawing corresponding to FIG. 1A of the first embodiment. In this embodiment, a semiconductor device 300 has the same structure as the semiconductor device 300 of the first embodiment with the exception that the distance "c" between the third contacts 164, 168 and the first gate electrodes 124, 144 of the first transistors 120, 140 is smaller than the distance "a", and the planar shape of the sources 128, 148 of the first transistors 120, 140 is smaller than the drains 126, 146. In the example shown in this drawing, the distance "c" is equal to the distance "b" shown in FIG. 1B in the first embodiment.

The third contacts 164 and 168 are connected to the sources 128 and 148 of the first transistors 120 and 140. For example, with a circuit such as an LNA (Low Noise Amplifier), a capacitance between the gate and the drain has a greater influence on the circuit characteristics than a capacitance between the gate and source. The extent of degradation of the circuit characteristics can therefore be limited even if the distance "c" is made smaller than the distance "a" as in this embodiment.

It is therefore possible to obtain the same results as for the first embodiment with this embodiment. The resistance occurring at the sources 128, 148 therefore become small because a distance between the first gate electrodes 124, 144 and the third contacts 164, 168 becomes shorter.

FIG. 5 is a plan view showing a structure for the essential parts of a semiconductor device 300 of a preferred embodiment. In this embodiment, the semiconductor device 300 is the same as for the first embodiment with the exception that the first transistors 120, 140 have a multi-finger structure. Only the first transistor 120 is shown in FIG. 5 and depiction of the first transistor 140 is omitted.

The first transistor 120 has a plurality of first gate electrodes 124. The first gate electrodes 124 extend in parallel to each other. Sources 128 and drains 126 are alternately formed at regions between corresponding first gate electrodes 124. The sources 128 and the drains 126 are equal in size. Third contacts 164 are respectively connected to the plurality of sources 128 and first contacts 162 are respectively connected to the plurality of drains 126.

The plurality of first gate electrodes 124 is connected to a single wire (not shown) and the plurality of first contacts 162 is connected to a single wire (not shown). The plurality of third contacts 164 are also connected to a single wire (not shown). The first transistors 120 with a multi-finger structure therefore function overall as a single transistor.

The plurality of first contacts 162 are such that the distance "a" from respective first gate electrodes 124 is larger than a distance "b" from the second gate electrodes 224, 244 shown in FIGS. 1B and 2B to the second contacts 262, 264, 266, and 268 in the first embodiment. The plurality of third contacts 164 are also such that the distance "c" from the respective first gate electrodes 124 is greater than the distance "b" and is equal to the distance "a".

It is therefore possible to obtain the same results as for the first embodiment with this embodiment.

Figure 6:
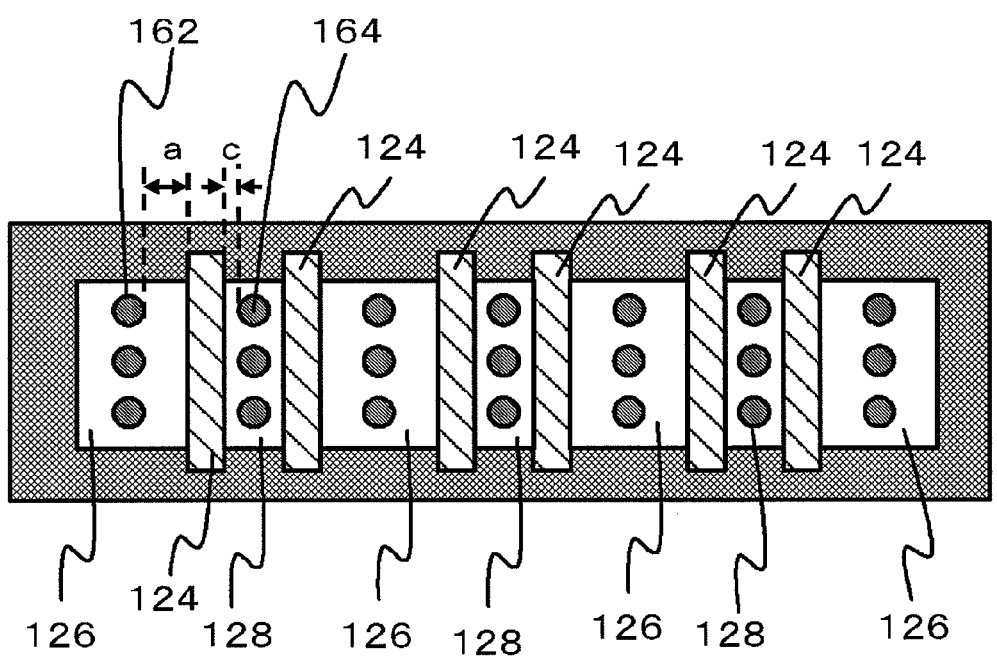
FIG. 6 is a plan view of a configuration for the essential parts of a semiconductor device of a fourth embodiment.

FIG. 6 is a cross-sectional view showing a structure for the semiconductor device 300 of a fourth embodiment and is a view corresponding to FIG. 5 of the third embodiment. In this embodiment, the semiconductor device 300 has the same configuration as the semiconductor device 300 of the third embodiment with the exception of the following points. First, at the first transistors 120, 140, the size of the sources 128, 148 is smaller than the drains 126, 146. The distance "c" from the third contacts 164 to the first gate electrodes 124 is smaller than the distance "a" from the first contacts 162 to the first gate electrodes 124 and is equal to the distance "b" shown in the first embodiment. Only the first transistor 120 is shown in FIG. 6 and depiction of the first transistor 140 is omitted.

It is therefore possible to obtain the same results as for the third embodiment with this embodiment. The resistance occurring at the sources 128, 148 can therefore be made small because a distance between the first gate electrodes 124, 144 and the third contacts 164, 168 can be made smaller. It is therefore possible to make the first transistors 120, 140 small because the sources 128, 148 can be made small.

A description is given in the above of embodiments of the present invention with reference to the drawings but these merely exemplify the present invention and various configurations other than those above can also be adopted. It is also possible for, for example, the transistors constituting the high-frequency circuit 100 to be n-channel-type transistors rather than CMOS transistors.

It is apparent that the present invention is not limited to the above embodiments, but may be modified and changed without departing from the scope and spirit of the invention.

What is claimed is:

1. A semiconductor device comprising:
a first circuit connected to a first power supply terminal and a first ground terminal;
a second circuit connected to a second power supply terminal and a second ground terminal;
a first transistor constituting part of the first circuit;
a second transistor constituting part of the second circuit;
a first contact connected to a source or drain of the first transistor; and
a second contact connected to a source or drain of the second transistor,
wherein a minimum distance "a" from a first gate electrode that is a gate electrode of the first transistor to the first contact is greater than a minimum distance "b" from a second gate electrode that is the gate electrode of the second transistor to the second contact and the thickness of gate insulation films of the first transistor and the second transistor are substantially equal.

2. The semiconductor device according to claim 1, wherein the first circuit is an analog circuit and the second circuit is a digital circuit.

3. The semiconductor device according to claim 1, wherein an impurity structure for the sources and drains of the first transistor and the second transistor are the same.

4. The semiconductor device according to claim 1, wherein impurity structures for channels of the first transistor and the second transistor are the same.

5. The semiconductor device according to claim 1, wherein the first contact is connected to the drain of the first transistor.

6. The semiconductor device according to claim 5, further comprising a third contact connected to the source of the first transistor,
wherein a minimum distance "c" between the third contact and the first gate electrode is shorter than the minimum distance "a".

7. The semiconductor device according to claim 5, further comprising a third contact connected to the source of the first transistor,
wherein a minimum distance "c" between the third contact and the first gate electrode is equal to the minimum distance "a".

8. The semiconductor device according to claim 1, wherein the first transistor has a multi-finger structure.

9. The semiconductor device according to claim 1, wherein all of the transistors constituting the first circuit are first transistors where the minimum distance "a" is greater than the minimum distance "b".

10. A semiconductor device comprising:
a first circuit connected to a first power supply terminal and a first ground terminal;
a second circuit connected to a second power supply terminal and a second ground terminal;
a first transistor constituting part of the first circuit;
a second transistor constituting part of the second circuit;
a first contact connected to drain of the first transistor; and
a second contact connected to a source or drain of the second transistor,
a third contact connected to a source of the first transistor,
wherein a minimum distance "a" from a first gate electrode that is a gate electrode of the first transistor to the first contact is greater than a minimum distance "b" from a second gate electrode that is the gate electrode of the second transistor to the second contact,
a minimum distance "c" between the third contact and the first gate electrode is greater than the minimum distance "b", and the thickness of gate insulation films of the first transistor and the second transistor are substantially equal.

11. The semiconductor device according to claim 10, further comprising a fourth contact connected to the source of the second transistor, wherein a minimum distance "d" between the fourth contact and the second gate electrode is shorter than the minimum distance "a".

12. A semiconductor device comprising:

a first circuit connected to a first power supply terminal and a first ground terminal;

a second circuit connected to a second power supply terminal and a second ground terminal;

a first transistor constituting part of the first circuit;

a second transistor constituting part of the second circuit;

a first contact connected to a source or drain of the first transistor; and a second contact connected to a source or drain of the second transistor, wherein a minimum distance "a" from a first gate electrode that is a gate electrode of the first transistor to the first contact is greater than a minimum distance "b" from a second gate electrode that is the gate electrode of the second transistor to the second contact and the thickness of gate insulation films of the first transistor and the second transistor are substantially equal, and wherein a magnitude of a power supply voltage to the first circuit and the second circuit is substantially equal.

* * * * *